United States Patent [19]
Dauben et al.

[11] Patent Number: 5,846,369
[45] Date of Patent: Dec. 8, 1998

[54] METHOD OF CONNECTING THE PARTS OF A MULTI-PART METAL CASING BY ADHESIVE

[75] Inventors: Peter Dauben, Altdorf; Stefan Kaspar, Leinburg, both of Germany

[73] Assignee: Diehl Stiftung & Co., Nuremberg, Germany

[21] Appl. No.: 867,998

[22] Filed: Jun. 3, 1997

[30] Foreign Application Priority Data

Jun. 7, 1996 [DE] Germany .................. 196 22 817.4

[51] Int. Cl.⁶ .................................................. H01K 14/00
[52] U.S. Cl. ............................................ 156/247; 29/840
[58] Field of Search .................... 156/285, 247; 29/840

[56] References Cited

U.S. PATENT DOCUMENTS 5,399,223  3/1995  Vogt ........................................ 156/285

*Primary Examiner*—Francis J. Lorin
*Attorney, Agent, or Firm*—Scully, Scott, Murphy & Presser

[57] ABSTRACT

The invention concerns a method of connecting the parts of a multi-part metal casing for PCMCIA-cards, in which the cover (2) is provided at its casing inside with an adhesive foil (13), then laid in a pressing tool onto the frame (5) which in a pre-assembled condition carries a printed circuit board with a socket connector strip, and pressed under pressure and temperature.

11 Claims, 2 Drawing Sheets

METHOD OF CONNECTING THE PARTS OF A MULTI-PART METAL CASING BY ADHESIVE

BACKGROUND OF THE INVENTION

1. Field of the Invention

The invention concerns a method of connecting the parts of a multi-part metal casing by adhesive, in particular a metal casing for PCMCIA-cards, the casing comprising a frame and at least one cover.

2. Discussion of the Prior Art

Casings of that kind are known and have already been on the market in the form of plastic casings for years. Recently such casings are made from metal and in particular copper alloys. In the case of metal casings the usual practice is for the parts of the casing to be welded together, in particular by means of a laser. Attempts have also been made to solder casings of that kind. As the casings have a socket connector strip with usually 68 connections and that socket connector strip cannot be made of metal, for reasons relating to insulation, the expenditure in terms of preparing the surface of the socket connector strip in order then to be able to solder same is relatively high.

SUMMARY OF THE INVENTION

The aim of the present invention is to provide a method with which it is possible to achieve a good connection between the parts of the casing with good to very good sealing integrity and at low cost.

The object of the present invention is attained through a method of connecting the parts of a multi-part metal casing by an adhesive connection, in particular a metal casing for PCMCIA-cards, wherein the casing comprises a frame and at least one cover, wherein the cover is provided with an adhesive foil toward the inside of the casing, then laid in a pressing tool onto the frame which, as a pre-assembled unit, carries a printed circuit board with electronic components and a socket connector strip, and pressed for a period of about 5 minutes to 10 seconds under pressure and temperature of about 120°–180° C. applied in a region R of the frame, and then the casing which is closed in that manner is cooled down and removed from the pressing tool.

A particularly desirable application of the method pertains to the use of two, preferably identical covers, which are applied to the frame so as to close the latter from above and below.

The basic concept of the invention is that the cover or covers is or are provided on the casing inside thereof in a preparatory step with an adhesive foil which is adhesive on both sides, the covers are applied to the frame and they are glued together in a press under pressure and temperature.

That adhesive method not only has clear advantages over welding or soldering in terms of manufacturing costs, but it also has the merits set forth hereinafter.

The temperature loading on the electronic components in the procedure for closing the casing is lower than when using welding or soldering. That affords a lower failure rate in regard to the electronic components.

Due to the adhesive connection the mechanical loadings which can be carried by the casing and which can be tolerated without damage such as for example torques and flexural moments, by virtue of the elasticity of the adhesive foil, are higher than in the case of welded or soldered casings.

The adhesive material is not liquid at the operating temperature in the press and therefore does not escape from the adhesion gap. The casing therefore does not have to be subjected to a finishing operation, as when using soldering. Besides that advantage in terms of production costs, there are also further advantages because there is no need for surface pre-treatment and due to the absence of expensive special items of equipment as are necessary when using welding, as well as lower environmental and disposal problems.

In spite of those advantages it is possible to achieve connections enjoying a high level of sealing integrity ($<10^{-6}$ mbar l/s), including adequate conductivity in the connection in order to achieve a high level of EMV-security.

In accordance with a development of the invention, application of the adhesive foil to the cover can advantageously be effected by a procedure wherein applied by the action of heat and low pressure to a metal strip, preferably a copper strip, in a continuous run procedure, is an adhesive foil which is adhesive on both sides and which carries a separation or detachment paper on the side remote from the metal strip, the covers are then stamped out in the appropriate size and then the separation or detachment paper is pulled off.

Depending on the respective embodiment of such covers a further development of the invention provides that the covers are deep-drawn prior to the stamping-out operation.

The adhesive foil is preferably stuck onto the metal strip at a temperature of about 120° C. under low pressure and with a passage speed of about 1 meter per minute.

Another advantageous configuration of the invention provides that after introduction of the casing parts to be connected (cover, frame) into the pressing tool, a pressure of about 0.5–2 N/mm² preferably 1 N/mm², is applied to the casing parts in the region of the frame, and then heating to a temperature of about 120° C. to 180° C. is effected.

In order as far as possible to protect the electronic components in the casing from the effect of heat, a further embodiment of the invention provides that the central portion of the cover or covers is cooled during the application of pressure and temperature in the region of the frame. In that case the temperature difference at the cover between the heated region on the frame and the cooled central part can be up to 100° C.

BRIEF DESCRIPTION OF THE DRAWINGS

The method according to the invention will be described in greater detail hereinafter with reference to the drawings in which.

DETAILED DESCRIPTION OF PREFERRED EMBODIMENTS

Figure 1:
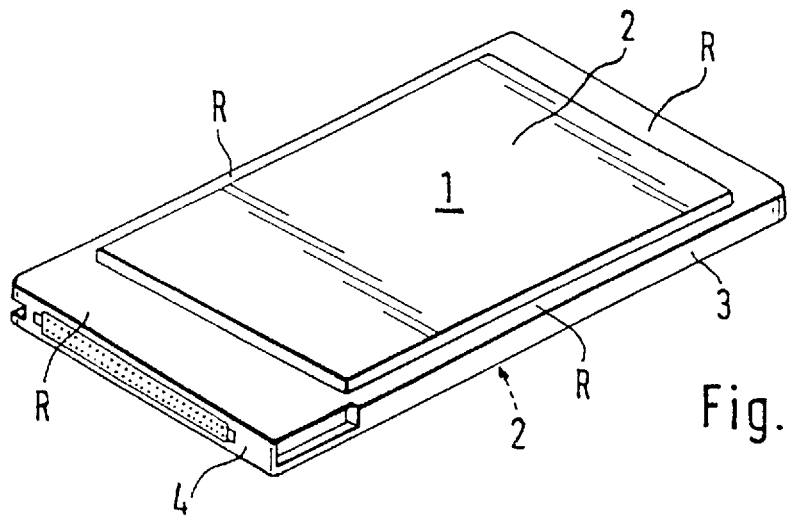
FIG. 1 shows a closed casing.

FIG. 1 shows a finished PCMCIA-casing 1 whose top and bottom sides are each formed by a respective cover 2, whose side edges are formed by a frame 3 and whose narrow left-hand side is formed by a socket connector strip 4. The socket connector strip contains 68 socket connections with which the casing can be pushed onto corresponding plug connections in a computer. At the locations identified by R in the region of the frame of the casing 1, temperature and pressure are applied by the pressing tool during the adhering procedure.

Figure 2:
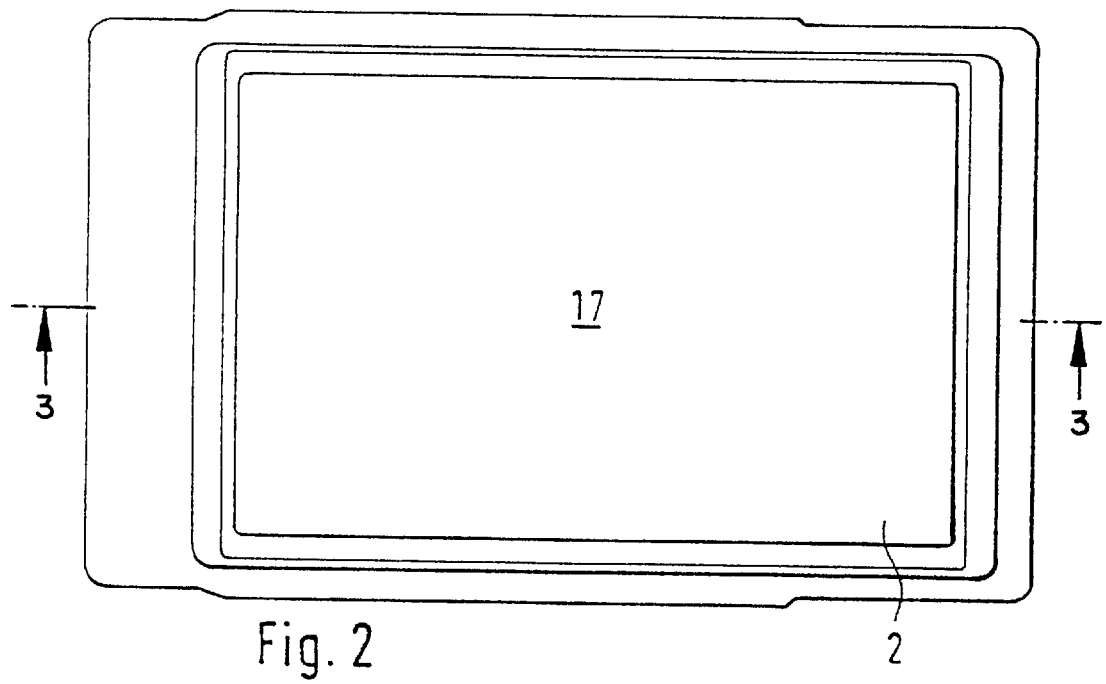
FIG. 2 is a plan view of a cover.
Figure 3:
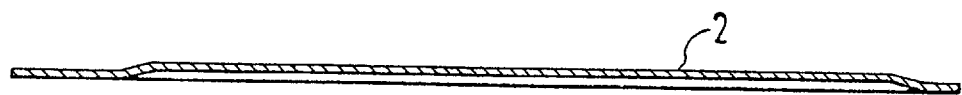
FIG. 3 shows a cover in section taken along line A—A in FIG. 2.

FIGS. 2 and 3 show a cover in plan view and in section, in this case still without the adhesive foil. The cover is preferably made from a copper alloy CuNi9Sn2. Two of those covers are required for closing the casing. The adhesive foil is applied (not shown here) at the casing inside of the covers. The adhesive foil extends over the entire surface area of the covers and remains fully present even after deep drawing thereof by virtue of its elasticity.

Figure 4:
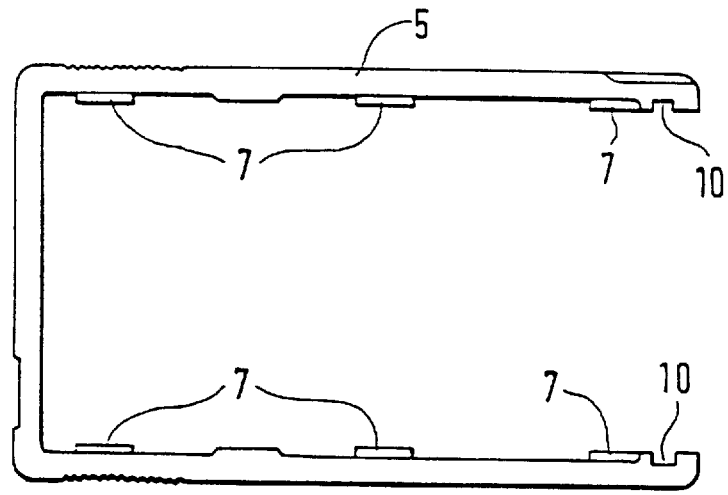
FIG. 4 shows a frame.
Figure 5:
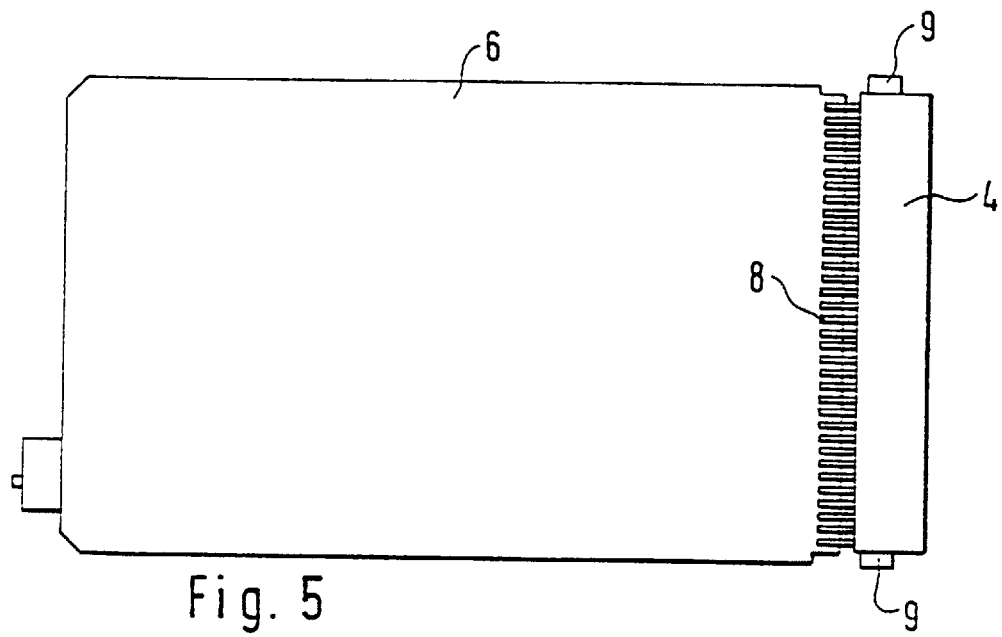
FIG. 5 shows a printed circuit board, diagrammatically illustrated with socket connector strip arranged thereon.

FIG. 4 shows the metal frame 5 in which a printed circuit board 6 as shown in FIG. 5 is glued on the projections 7. The socket connector strip 4 with its connecting lugs 8 which are in the interior of the casing is shown on that printed circuit board 6 in which the conductor tracks and the electronic components disposed thereon are not shown, for the sake of clarity. The socket connector strip 4 has at the sides projection portions 9 which engage into and close the corresponding grooves 10 of the frame 5. The socket connector strip is particularly guided in the frame and is afforded sufficient strength, by virtue of those projection portions 9.

Figure 6:
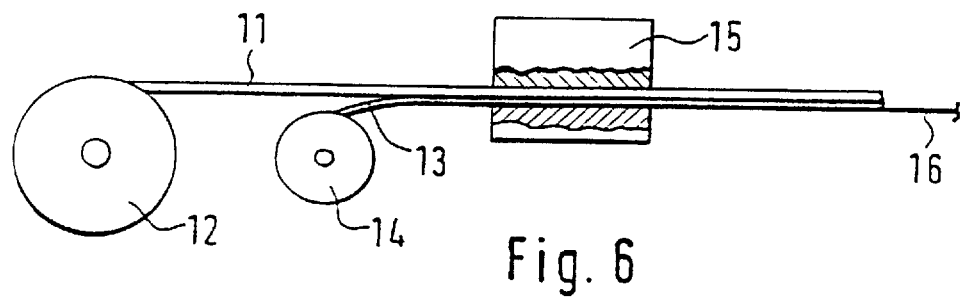
FIG. 6 is a diagrammatic view showing the procedure for making the adhesive connection between a metal strip and an adhesive foil.

To prepare for the method according to the invention, as shown in FIG. 6 a metal strip 11 which is wound on a drum 12 is fed together with an adhesive foil 13 which is also wound on a drum 14 to a continuous-run press 15 in which the metal strip 11 and the adhesive foil 13 are adhesively connected at a temperature of about 120° C. and under a slight pressure. A separation or detachment paper 16 for protecting the second adhesive side of the adhesive foil is applied thereto. In a stamping apparatus (not shown) covers 2 are successively deep-drawn and then stamped out, as can be seen from the view in FIG. 3. By virtue of the elasticity of the adhesive foil, it is not damaged in the deep-drawing and stamping procedure. Before the covers 2 are introduced into a press, the separation or detachment paper 16 is pulled off. The covers are applied in the press to the top and bottom sides of the frame 5. A printed circuit board with electronic components and a socket connector strip 4 soldered thereto is already glued in position in the frame 5 at the support points 7. The casing is completed by the covers 2 at the top and bottom sides.

The punch member is now moved downwardly in the pressing tool and a pressure of 1 N/mm$^2$ is built up. An induction coil arranged in the pressing tool is then heated up and generates a temperature of about 160° C. at the contact points on the pressing tool. The contact points of the pressing tool against the casing are identified by R in FIG. 1. It will be seen that the covers 2 are only heated at their contact points on the frame. It is only there that the adhesive becomes hot and hardens, with its adhesive capability becoming fully effective. The three casing parts and the socket connector strip 4 are thus glued together.

An adhesive foil as is available on the market for example under the trade name Tesa 8410 (Tesa is a registered trademark) bears as the adhesive material nitrile rubber/phenol resin with an adhesive strength >10 N/mm$^2$. That adhesive material permits a high level of sealing intregity in respect of the glued casing, which can achieve a leakage rate of greater than $10^{-6}$ l/s. That satisfies even high industrial requirements in terms of the sealing integrity of such casings. By virtue of the contour of the stamped covers and the frame, under the above-described manufacturing conditions there is a conductive connection between the individual parts, with contact resistances in the milliohm range, so as to ensure a good level of EMV-safety in respect of the interior of the PC-card.

After the casing has been disposed in the pressing tool at the specified temperature for several minutes, in which case the central portion 17 of the covers was cooled down from above and below to a temperature of about 80°–90° C., the heating is switched off with the pressure being maintained, the casing is cooled down to a removal temperature, and it is then removed.

The casings are thus finished and there is no need for any finishing operation. Because of the adhesive connection it is possible if faults occur in the electronics, either immediately after manufacture or even only at a later date, to re-open the adhesive connection, effect a repair and re-form the adhesive connection. Simple repair options of that kind are not available when dealing with casings which are soldered or, even more so, welded.

We claim:

1. A method of connecting the parts of a multi-part metal casing by adhesive connection, wherein the casing includes a frame and at least one cover; comprising providing the cover (2) with an adhesive foil (13) towards the interior of the casing, said adhesive foil being adhesive on both sides thereof; positioning said cover in a pressing tool on the frame (5) which, as a preassembled unit, carries a printed circuit board (6) with electronic components and a socket connector strip (4); applying pressure in a region R of the frame for a period of about 5 minutes to 10 seconds under a pressure within the range of about 0.5–2 N/mm$^2$ and at a temperature within the range of about 120°–180° C.; thereafter cooling the resulting closed casing (1); and removing the casing from the pressing tool.

2. A method according to claim 1, comprising applying two identical covers (2) to the frame (5) from, respectively, above and below.

3. A method according to claim 1 or 2, comprising applying said adhesive foil (13) under the effects of heat and a low pressure to a metal strip (11) in a continuous-running process, said adhesive foil (13) carrying a separating paper (16) on a side facing away from the metal strip; stamping-out the at least one cover (2) in a specified size; and pulling off the separating paper (16).

4. A method according to claim 3, wherein the metal strip (11) comprises a copper strip.

5. A method according to claim 3, comprising deep-drawing the at least one cover (2) prior to implementing the stamping-out step.

6. A method according to claim 3, comprising adhering the adhesive foil (13) onto the metal strip (11) at a temperature of about 120° C. under a low pressure and at a running speed of about 1 meter per minute.

7. A method according to claim 1, wherein said pressure comprises about 1 N/mm$^2$.

8. A method according to claim 1 or 2, comprising cooling a central part (17) of the at least one cover (2) to protect the electronic components located in the casing during the application of pressure and temperature to the region R of the frame.

9. A method according to claim 8, wherein a temperature differential of up to about 100° C. is present at the cover between the heated region R on the frame and the cooled central part (17).

10. A method according to claim 1, wherein said metal casing comprises a casing for PCMCIA-cards.

11. A method according to claim 1, wherein said adhesive foil (13) comprises an adhesive paper.

* * * * *

UNITED STATES PATENT AND TRADEMARK OFFICE
CERTIFICATE OF CORRECTION

PATENT NO. : 5,846,369
DATED : December 8, 1998
INVENTOR(S) : Aldo Arena, et al.

It is certified that error appears in the above-identified patent and that said Letters Patent is hereby corrected as shown below:

<u>Column 4,</u>
Line 57, Claim 9: "at the cover" should read --at least one cover--

Signed and Sealed this

Tenth Day of July, 2001

Attest:

NICHOLAS P. GODICI
Attesting Officer    Acting Director of the United States Patent and Trademark Office